United States Patent [19]

Wanat et al.

[11] 4,374,920
[45] Feb. 22, 1983

[54] POSITIVE DEVELOPER CONTAINING NON-IONIC SURFACTANTS

[75] Inventors: Stanley F. Wanat, Scotch Plains; Shane Hsieh, Bridgewater, both of N.J.

[73] Assignee: American Hoechst Corporation, Somerville, N.J.

[21] Appl. No.: 287,465

[22] Filed: Jul. 27, 1981

[51] Int. Cl.$^3$ .............................................. G03C 5/24
[52] U.S. Cl. .................................... 430/331; 430/309
[58] Field of Search ................................. 430/331, 309

[56] References Cited

U.S. PATENT DOCUMENTS

| | | |
|---|---|---|
| 3,110,596 | 11/1963 | Heiss et al. . |
| 3,586,504 | 6/1971 | Coates et al. . |
| 3,669,660 | 6/1972 | Golda et al. . |
| 3,707,373 | 12/1972 | Martinson et al. . |
| 3,738,850 | 6/1973 | Radell et al. . |
| 3,745,028 | 7/1973 | Rauner . |
| 3,868,254 | 2/1975 | Wemmers ............................ 430/331 |
| 3,891,438 | 6/1975 | Katz ..................................... 430/331 |
| 3,891,439 | 6/1975 | Katz et al. . |
| 3,954,472 | 5/1976 | Walls . |
| 4,130,425 | 12/1978 | Boyd . |
| 4,308,340 | 12/1981 | Walls ................................... 430/331 |

FOREIGN PATENT DOCUMENTS 50-51324  5/1975  Japan .

OTHER PUBLICATIONS

Schick, "Non-Ionic Surfactants," Marcel Dekker, Inc., N.Y., c 1967, pp. 413-414.
Chemical Abstracts, 186365q Presensitized Photolithographic Printing Plates, Wade, John E., vol. 83, 1975, p. 491.
Chemical Abstracts, 99071j Liquid Developers for Lithographic Photosensitive Plates Containing Diazo Compound, Matsumoto, Hiroshi, vol. 86, 1977, p. 649.
Chemical Abstracts, 44133x Developers for Diazo-Sensitized Lithographic Plates, Rowe, William, vol. 81, 1974.
Chemical Abstracts, 170917k Developer for Photosensitive Lithographic Plates Containing o-Quinonediazide Compounds, Watanabe, Masaru, vol. 83, 1975, p. 458.

*Primary Examiner*—John D. Smith
*Attorney, Agent, or Firm*—Richard S. Roberts

[57] ABSTRACT

A developer composition for positive working lithographic printing plates and photoresists comprising an aqueous alkaline solution with a non-ionic surfactant.

8 Claims, No Drawings

POSITIVE DEVELOPER CONTAINING NON-IONIC SURFACTANTS

BACKGROUND OF THE INVENTION

The present invention relates to developer compositions for lithographic printing plates. More particularly, the invention relates to developers for printing plates of the so-called positive type which are sensitized with o-quinone diazide photosensitive materials.

It is known that the diazo groups of o-quinone diazides are removed by irradiation to actinic light, and that the compound itself changes to a compound with a carboxyl group. When the photosensitive coating containing o-quinone diazide is exposed to the light and developed with an alkaline developer, the part exposed to light is removed while the part not exposed to light remains as the image. Because of this characteristic, it is known as a positive-type photosensitive component for printing plates or for photoresist compositions. Compositions of o-quinone diazide are usually mixed with alkali-soluble resins having economical and practical advantages in such uses. Mixtures of phenol formaldehyde resins, or cresol formaldehyde resins, are generally used as the alkali soluble resins. Trisodium phosphate, sodium hydroxide, or sodium silicate alone, or their mixed aqueous solutions are used as a developer for sensitive films containing these o-quinone diazides. However, aqueous solutions of these developers tend to have detrimental etching effects on such printing plate substrate metals as aluminum. Also, the results of development vary considerably. In extreme cases, even a slight excess of developing time causes failure in image formation. If alkalinity is decreased, development speed decreases unacceptably. If alkalinity is increased, the aluminum or aluminum oxide substrate etches away, thus undesirably undermining and removing image as well as non-image areas.

Japanese Pat. No. 75-51324 suggests one method of attacking this problem. It teaches the addition of both an anionic and a dipolar surfactant to the aqueous alkaline developer solution.

Surfactants have also been used in other types of developers. U.S. Pat. No. 3,891,438 teaches the development of negative working printing plates sensitized by diazonium salts with aqueous solutions of organolithium salts to which anionic, cationic or non-ionic surfactants have been added.

SUMMARY OF THE INVENTION

The present invention provides a developer solution for positive working photographic elements such as lithographic printing plates and photoresists which comprises an aqueous solution of hydroxide ions such as from an alkali and a compatible non-ionic surfactant.

This composition has been determined to substantially preserve the development speed as compared to an element developed with the alkali alone in solution and yet effectively, substantially acts as a barrier to the etching action of the aluminum.

DETAILED DESCRIPTION OF THE PREFERRED EMBODIMENT

As hereinbefore mentioned the developer of the present invention comprises an aqueous solution of an alkali and a compatible non-ionic surfactant.

Any composition capable of releasing hydroxide ions in solution is a suitable alkali useful for the practice of this invention. These include compounds which directly ionize in water or salts which generate hydroxide ions in water.

Non-limiting examples of alkalis useful for the practice of the present invention include sodium silicate, sodium metasilicate, trisodium phosphate, monosodium phosphate and sodium hydroxide.

Non-limiting examples of non-ionic surfactants useful for the practice of the present invention are those which are compatible with the alkali solution. That is, those which do not cause a precipitate when mixed with the aqueous alkali solution. Examples include ethoxylated phenols, tetramethyl decynediol, ethoxylated tetramethyl decynediol, ethoxylated aliphatic alcohols, alkylene oxide block copolymers, fatty acid amides, and ethoxylated diols. Especially preferred surfactants include Triton X-100 available from Rohm & Haas of Philadelphia, Pa; Tergitol Min Foam 1x available from Union Carbide Corporation; Antarox BL-330 available from GAF and Amidox C-5 available from Stepan Chemical Co. of Northfield, Ill.

Other preferred surfactants are the Surfynols available from Air Products and Chemicals, Inc. of Allentown, Pa. These generally have the formula

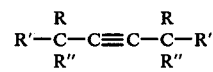

where
R = methyl
R' = isobutyl
R" = OH or $(-O-CH_2-CH_2)_x-OH$

These surfactants are believed to act as a barrier to aluminum etching while maintaining the speed of the aqueous alkaline developer.

Commonly, salts are used in addition to the source of hydroxide ions. These are capable of forming hydrophilic water-insoluble coatings on the metal, produce alkaline-reacting systems themselves in water or help buffer the system. These may be present in the range of 0.2–10% by weight with the preferred salt content in the range of 0.5–5% by weight.

Representative of these salts are the following in aqueous alkaline solution:

salts of hydrofluosilicic acid $M^I_2(SiF_6)$ and $M^{II}(SiF_6)$
salts of hydrofluotitanic acid $M^{II}(TiF_6)$ and $M^{III}(TiF_6)$
salts of hydrofluostannic acid $M^I(SnF_6)$
salts of hydrofluoboric acid $M^I(BF_6)$
salts of orthosilicic acid or metasilicic acid $M^I O \cdot xSiO_2 \cdot xH_2O$
salts of orthotitanic acid $2M^I_2O \cdot TiO_2$ and
salts of stannic acid $M^I(Sn(OH)_6)$ wherein M is a metal ion. These salts are more fully described in U.S. Pat. No. 3,110,596 which is incorporated herein by reference.

In the preferred embodiment, the alkali may be present in the developer in an amount of from about 0.2 to about 12 parts by weight; more preferably 0.2 to about 10; most preferably 3 to about 8.

In the preferred embodiment, the non-ionic surfactant may be present in the developer of the present invention in an amount of from about 0.1% to about 10% by weight; more preferably 0.5 to 3% by weight of the developer.

The pH of the developers of this invention generally range from about above 7.0 to about 14, more preferably about 11 to about 13.

Preferred developer formulations comprise the Triton X-100 surfactant in any of the following developers:

|    |    | Weight Percent |
|----|----|----|
| 1. | Soft Water | 91.545 |
|    | Sodium Metasilicate-5 $H_2O$ | 3.988 |
|    | Trisodium Phosphate-12 $H_2O$ | 3.423 |
|    | Monosodium Phosphate | 0.337 |
|    | Sodium Hydroxide (Reagent Grade) | 0.707 |
|    |    | 100.000 |
|    |    | Weight Percent |
| 2. | Soft Water | 92.196 |
|    | Sodium Metasilicate-5 $H_2O$ | 4.016 |
|    | Trisodium Phosphate-12 $H_2O$ | 3.448 |
|    | Monosodium Phosphate | 0.340 |
|    |    | 100.000 |
| 3. | 7.5 g. of tertiary sodium orthophosphate-12$H_2$ | |
|    | 3.5 g. of sodium metasilicate | |
|    | 2.0 g. of primary sodium orthophosphate-1$H_2O$ | |
|    | 1.0 g. of water-soluble methyl cellulose of medium viscosity | |
|    | 985.0 g. of distilled water | |
|    | The pH value of the solution is 11.1 | |
| 4. | 4.5 g. of sodium metasilicate | |
|    | 0.9 g. of sodium hexametaphosphate | |
|    | 994.6 g. of distilled water | |
|    | The pH value of the solution is 11.35 | |
| 5. | 56.0 g. of sodium metasilicate | |
|    | 10.0 g. of sodium hexametaphosphate | |
|    | 934.0 g. of distilled water | |
|    | The pH value of the solution is 11.65 | |
| 6. | 58.0 gms. of sodium metasilicate | |

|    | 18.0 gms. of tertiary sodium orthophosphate-12$H_2O$ | |
|----|----|----|
|    | 4.0 gms. of primary sodium orthophosphate | |
|    | 920.0 gms of distilled water | |
|    | The pH value of the solution is 11.8 | |
|    |    | Weight Percent |
| 7. | Distilled water | 95.9% |
|    | Sodium metasilicate | 2.0 |
|    | Monosodium phosphate | 0.8 |
|    | Sodium hydroxide | 0.8 |
| 8. | Distilled water | 95.835% |
|    | Sodium metasilicate | 1.912 |
|    | Monosodium phosphate | 0.765 |
|    | Sodium hydroxide | 1.149 |

The following non-limiting examples demonstrate the invention.

EXAMPLE 1

5×7" samples of P-150 (positive printing plates available from the Azoplate Division of American Hoechst Corporation, Branchburg, N.J.) are exposed in a vacuum frame for a fixed number of time units (30 secs. e.g.). In a small tray ~750 ml. of positive developer is used to develop a plate. The tray is rocked on a rocker attached to a timer. The developer composition may be as follows:

| Water | 92.196% |
|----|----|
| Sodium metasilicate | 4.016% |
| trisodium phosphate | 3.448% |
| monosodium phosphate | 0.340% |
|  | 100.000% |

Development is fixed at 15 minutes. The plate is rinsed and blotted dry. This is a control sample. Sample plates are then successively developed in a similar fashion with 7.5 ml. (1%) of the surfactant under study. plates are rinsed and dried and compared to the control. Table 1 demonstrates the results effected with several surfactant types.

Comparison is based on (1) Stauffer 21 step scale (a higher clear step indicates more aggressive development. (2) Half tone dot sharpening (reduction) or loss. (3) Attack of non-image area oxide as well as the intermediate steps of the Stauffer scale, as evidenced by formation of a white powdery oxide which can be wiped off readily.

TABLE 1

| Surfactant | Manufacturer | Type | Stouffer step wedge | Dot sharpening | oxide attack | image attack |
|----|----|----|----|----|----|----|
| Surfynol 440 | Air Products & Chemicals | Non-ionic | clear 3 ghost 6 | none | none | slight |
| Surfynol 465 | " | " | clear 4 ghost 7 | none | none | slight |
| Surfynol 485 | " | " | clear 4 ghost 7 | none | none | slight |
| Triton X-100 | " | " | clear 3 ghost 6 | none | none | none |
| Gafac BI-750 | GAF | anionic | clear 6 ghost 10 | severe | severe | moderate |
| Control | none | N/A | clear 8 ghost 11 | severe | severe | moderate |

EXAMPLE 2

The procedure of Example 1 may be repeated using the following developer:

| Water | 91.545% |
|----|----|
| Sodium metasilicate | 3.988% |
| trisodium phosphate | 3.423% |
| monosodium phosphate | 0.337% |
| sodium hydroxide | 0.707% |
|  | 100.000% |

Since this is a more aggressive developer, the samples are rock developed for only 7 mins. All other aspects of the procedure were similar. The following results are noticed when the indicated surfactant is added at 1% by weight.

TABLE 2

| Surfactant | Manufacturer | Type | Stouffer step wedge | Dot sharpening | oxide attack | image attack |
|---|---|---|---|---|---|---|
| None control | N/A | — | plate almost devoid of coating with severe attack of aluminum surface. | | | |
| Aerosol OS | American Cyanamid | anionic | clear 9 ghost 13 | moderate | yes | yes |
| Triton X-100 | Air Products & Chem. | non-ionic | clear 5 ghost 9 | slight | slight | slight |
| Gafac RE-610 | GAF | anionic | clear 9 ghost 10 | severe | severe | moderate |
| Aerosol C-61 | American Cyanamid | cationic | almost complete loss of image & severe oxide attack | | | |

What is claimed is:

1. A developer for positive working photographic elements which comprises an aqueous solution of hydroxide ions having a pH above about 7.0 provided from an alkali having a concentration in the developer which ranges from about 0.2 to about 10 percent by weight; and a compatible non-ionic surfactant selected from the group consisting of one or more of tetramethyl decynediol and ethoxylated tetramethyl decynediol.

2. The developer of claim 1 further comprising one or more compounds selected from the group consisting of the metal salts of hydrofluosilicic acid, hydrofluotitanic acid, hydrofluostannic acid, hydrofluoboric acid, orthosilicic acid, metasilicic acid, orthotitanic acid and stannic acid.

3. The developer of claim 2 wherein the concentration of alkali ranges from about 0.2 to about 10 percent by weight.

4. The developer of claim 3 wherein the concentration of surfactant ranges from about 0.1 to about 10 percent by weight.

5. The developer of claim 1 wherein the concentration of surfactant ranges from about 0.1 to about 10 percent by weight.

6. A developer for positive working photographic elements which comprises an aqueous solution of hydroxide ions having a pH above about 7.0 from an alkali selected from the group consisting of one or more of trisodium phosphate, sodium hydroxide, monosodium phosphate, sodium silicate, and sodium metasilicate; and a compatible non-ionic surfactant selected from the group consisting of one or more of tetramethyl decynediol and ethoxylated tetramethyl decynediol.

7. The developer of claim 6 wherein the concentration of surfactant ranges from about 0.1 to about 10 percent by weight.

8. The developer of claim 6 further comprising one or more compounds selected from the group consisting of the metal salts of hydrofluosilicic acid, hydrofluotitanic acid, hydrofluostannic acid, hydrofluoboric acid, orthosilicic acid, metasilicic acid, orthotitanic acid and stannic acid.

* * * * *